US008817551B2

(12) United States Patent
Kuroda

(10) Patent No.: US 8,817,551 B2
(45) Date of Patent: Aug. 26, 2014

(54) SEMICONDUCTOR MEMORY DEVICE

(75) Inventor: Naoki Kuroda, Osaka (JP)

(73) Assignee: Panasonic Corporation, Osaka (JP)

( * ) Notice: Subject to any disclaimer, the term of this patent is extended or adjusted under 35 U.S.C. 154(b) by 215 days.

(21) Appl. No.: 13/620,667

(22) Filed: Sep. 14, 2012

(65) Prior Publication Data
US 2013/0016572 A1  Jan. 17, 2013

Related U.S. Application Data

(63) Continuation of application No. PCT/JP2011/002389, filed on Apr. 22, 2011.

(30) Foreign Application Priority Data

May 10, 2010 (JP) ................. 2010-108121

(51) Int. Cl.
*G11C 7/00* (2006.01)
*G11C 11/419* (2006.01)
*G11C 11/412* (2006.01)

(52) U.S. Cl.
CPC ............ *G11C 11/412* (2013.01); *G11C 11/419* (2013.01)
USPC .............. 365/189.05; 365/154; 365/210.1

(58) Field of Classification Search
CPC ....... G11C 7/22; G11C 7/1051; G11C 7/1078
USPC ................ 365/189.05, 154, 210.1
See application file for complete search history.

(56) References Cited

U.S. PATENT DOCUMENTS 6,804,153 B2 * 10/2004 Yoshizawa et al. ...... 365/189.15
7,286,430 B2 * 10/2007 Hanzawa et al. ........ 365/189.15
(Continued)

FOREIGN PATENT DOCUMENTS

| JP | 2004-171633 A | 6/2004 |
| JP | 2004-220721 A | 8/2004 |
| JP | 2005-267744 A | 9/2005 |
| JP | 2007-250020 A | 9/2007 |

OTHER PUBLICATIONS

K. Osada et al., "Universal-Vdd 0.65-2.0-V 32-kB Cache Using a Voltage-Adapted Timing-Generation Scheme and a Lithographically Symmetrical Cell," IEEE Journal of Solid-State Circuits, vol. 36, No. 11, pp. 1738-1744, Nov. 2001.

(Continued)

*Primary Examiner* — Son Dinh
(74) *Attorney, Agent, or Firm* — McDermott Will & Emery LLP

(57) ABSTRACT

A semiconductor memory device includes a memory cell array block including a plurality of memory cells each including a data holding circuit configured to store data using a first and a second circuit elements and a transistor configured to connect the data holding circuit and a bit line together, sense amplifiers connected to bit lines directly or via switches, and a dummy memory cell array including a plurality of dummy memory cells each having the same circuit configuration as that of the memory cell with respect to the element size and the layout configuration. The plurality of dummy memory cells each include at least one inverter circuit configuration, and are connected together by the inverter circuits being connected together in series. An output signal of the inverter circuit of one in the final stage of the dummy memory cells is an activation signal for the sense amplifiers.

18 Claims, 10 Drawing Sheets

(56) References Cited

U.S. PATENT DOCUMENTS

| | | |
|---|---|---|
| 2004/0141395 A1 | 7/2004 | Ohtsuki et al. |
| 2005/0073885 A1 | 4/2005 | Suzuki et al. |
| 2005/0207239 A1 | 9/2005 | Kodama |
| 2007/0247941 A1 | 10/2007 | Hirabayashi |

OTHER PUBLICATIONS

International Search Report mailed Aug. 2, 2011 issued in corresponding International Application No. PCT/JP2011/002389.

* cited by examiner

SEMICONDUCTOR MEMORY DEVICE

CROSS-REFERENCE TO RELATED APPLICATIONS

This is a continuation of PCT International Application PCT/JP2011/002389 filed on Apr. 22, 2011, which claims priority to Japanese Patent Application No. 2010-108121 filed on May 10, 2010. The disclosures of these applications including the specifications, the drawings, and the claims are hereby incorporated by reference in their entirety.

BACKGROUND

The present disclosure relates to semiconductor memory devices, and more particularly, to semiconductor memory devices in which accurate sense amplifier activation timing is generated using dummy memory cells.

Conventionally, for static random access memory (SRAM), there is a known technique of generating the timing of activating sense amplifiers using data read from a plurality of dummy memory cells each having the same transistor characteristics as those of memory cells. By the technique, the memory device can be accurately read without an influence of process variations and changes in ambient temperature or power supply voltage (see K. Osada et al., "Universal-Vdd 0.65-2.0-V 32-kB Cache Using a Voltage-Adapted Timing-Generation Scheme and a Lithographically Symmetrical Cell," IEEE Journal of Solid-State Circuits, Vol. 36, No. 11, pp. 1738-1744, November 2001).

There is also a proposed technique of generating the timing of activating sense amplifiers using dummy memory cells, taking into consideration the load of a column selector connected to bit lines of memory cells or a delay caused by the resistance of the bit line (see Japanese Patent Publication No. 2004-171633).

Here, a problem with the conventional technique of reducing the read time will be described. As device miniaturization by microfabrication process is advanced by scaling, variations in shape or amount of implanted impurity tend to increase, and therefore, variations in transistor characteristics tend to increase. In particular, the influence of the increase of the variations is obviously large on extremely small transistors used, for example, in memory cells. In the conventional art, variations in transistor characteristics can be reduced by using a plurality of dummy memory cells in a read circuit including dummy memory cells. In a single-end type amplifier which uses an inverter to read a dummy memory cell, in order to generate the timing of activating a cross-coupled type sense amplifier which amplifies complimentary data to read a memory cell, the potential difference of the complimentary data read from the memory cell needs to be sufficiently large for amplification of the memory cell sense amplifier when the inverter for the dummy memory cell activates an activation timing signal to a level exceeding the switching level. In order to accurately generate the timing, for example, it is necessary to reduce variations in the switching level of the inverter, or to adjust the read capability of the dummy memory cell so that the time required for the inverter to reach the switching level is equal to the time required to generate a potential difference required for amplification of the sense amplifier, i.e., considerably difficult circuit tuning is required. In other words, because the dummy memory cell is used, variations in transistor characteristics caused by the influence of the fabrication process etc. can be beneficially followed to obtain similar operation, and therefore, the use of the dummy memory cell is suitable for generation of the timing of activating the sense amplifier which is sufficient to prevent a failure in reading of memory cell data. However, it is difficult to reduce the read time.

Next, a technique of generating timing by using a delay of an inverter having logic transistor characteristics without using the dummy memory cell will be described. It is relatively easy to activate a sense amplifier activation timing signal by adjusting the drive capability of the inverter delay or the number of stages of delay circuits at a timing when the potential difference of complimentary data becomes one that is required for amplification of a sense amplifier, in order to generate the timing of activating the sense amplifier by using an inverter delay circuit including logic transistors. Because logic transistors are used as the inverter delay circuit, the area efficiency is considerably high compared to a read circuit which uses dummy memory cells corresponding to a column of memory cells, and variations in transistor characteristics can be reduced by increasing the transistor capability of the inverter delay circuit to some extent. However, the process variations, particularly, variations of the logic transistors and the memory cell transistors having different amounts of implanted impurity, may not have the same behavior. In particular, the difference in characteristics becomes significant, for example, under conditions that the power supply voltage is low or that the temperature is high or low. Even if timing is generated without a problem under normal conditions, the characteristics of the memory cell transistors may become extremely worse than the characteristics of the logic transistors under the above corner conditions, and the memory cell read operation may be excessively delayed from the timing of activation of the sense amplifier, resulting in erroneous operation.

SUMMARY

The present disclosure describes implementations of a semiconductor memory device which includes an inverter delay circuit as a dummy memory cell portion, whereby timing optimum to the timing of activating the sense amplifier can be generated, and accurate sense amplifier activation timing can be generated without erroneous operation under various conditions.

An example semiconductor memory device includes a memory cell array including a plurality of memory cells each including a data holding circuit configured to store data using a first and a second circuit elements and a transistor configured to connect the data holding circuit and a bit line together, and a dummy memory cell array including a plurality of dummy memory cells each having the same circuit configuration as that of the memory cell with respect to the element size and the layout configuration. The plurality of dummy memory cells each include at least one inverter circuit configuration, and are connected together by the inverter circuits being connected together in series.

With this configuration, the inverter circuit having the same characteristics as those of memory cell transistors is used in generation of sense amplifier activation timing by the inverter delay circuit, whereby the timing of activation of a sense amplifier for achieving high-speed operation can be generated easily and with a reduced operation margin, and without erroneous operation under corner conditions of process, voltage, temperature, etc.

Another example semiconductor memory device includes a memory cell array including a plurality of memory cells each including a data holding circuit configured to store data using a first and a second circuit elements and a transistor configured to connect the data holding circuit and a bit line together, a word line arranged in a row direction and connected to the memory cells, and a plurality of dummy memory cell arrays each including a plurality of dummy memory cells having the same circuit configuration as that of the memory cell with respect to the element size and the layout configuration. The plurality of dummy memory cells each include at least one inverter circuit configuration, and are connected together by the inverter circuits being connected together in series, an input signal line of the inverter circuit of one in the first stage of the plurality of dummy memory cells connected together and an output signal line of the inverter circuit of one in the final stage of the plurality of dummy memory cells connected together are arranged in the column direction, the plurality of dummy memory cell arrays are arranged in the column direction, and the output signal line of the inverter circuit of one in the final stage of the plurality of dummy memory cells connected together is output from each of the plurality of dummy memory cell arrays.

With this configuration, redundancy is imparted to the inverter delay circuit, and therefore, even if a defect occurs in the inverter delay circuit, the inverter delay circuit can be repaired. Also, the inverter delay circuits having different delay times are provided, and therefore, for example, if read operation from a memory cell becomes extremely slow under some process conditions, the inverter delay circuits can be switched to reduce or prevent the occurrence of a defect.

According to the present disclosure, optimum sense amplifier activation timing can be generated, and accurate sense amplifier activation timing can be generated without erroneous operation under various conditions.

DETAILED DESCRIPTION

Figure 1:
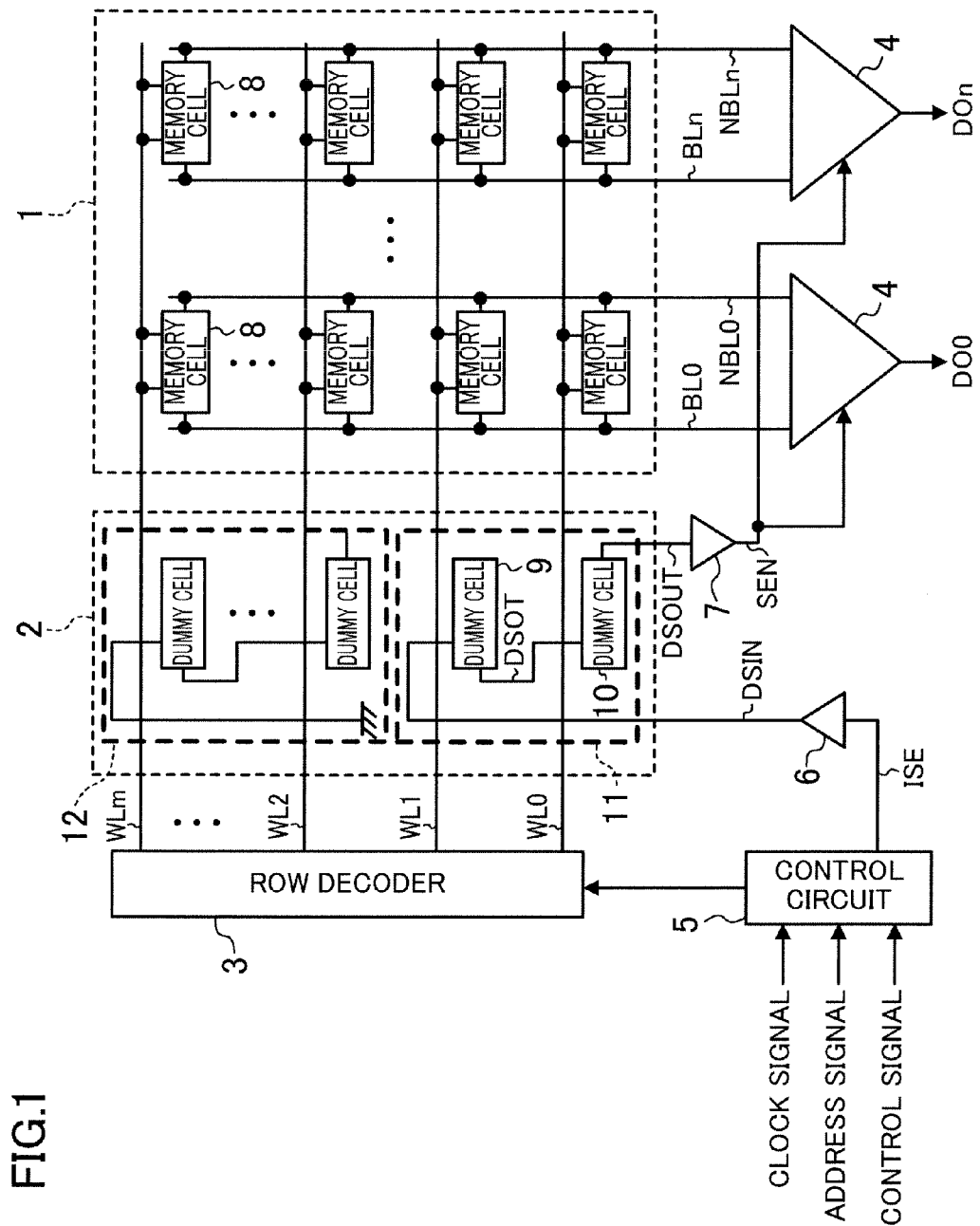
FIG. 1 is a block diagram showing a main configuration of a semiconductor memory device according to a first embodiment of the present disclosure.

Embodiments of the present disclosure will be described in detail hereinafter with reference to the accompanying drawings. The same or like parts are indicated by the same reference characters and will not be redundantly described in embodiments and variations described below.

<<First Embodiment>>

A semiconductor memory device according to a first embodiment of the present disclosure will be described by way of specific examples with reference to FIGS. 1, 2, 3, 4, 5, and 6.

The semiconductor memory device of FIG. 1 includes a memory cell array block 1 including a plurality of memory cells 8 arranged in a matrix, word lines WL0-WLm for controlling writing and reading of data to and from the memory cells 8, a row decoder 3 which controls the word lines WL0-WLm, complimentary bit line pairs BL0/NBL0-BLn/NBLn for wiring and reading data to and from the memory cells 8, sense amplifiers 4 which amplify read data on the bit line pairs BL0/NBL0-BLn/NBLn and output data signals DO0-DOn, a dummy memory cell array block 2, a control circuit 5, and a first and a second driver circuit 6 and 7.

Figure 2:
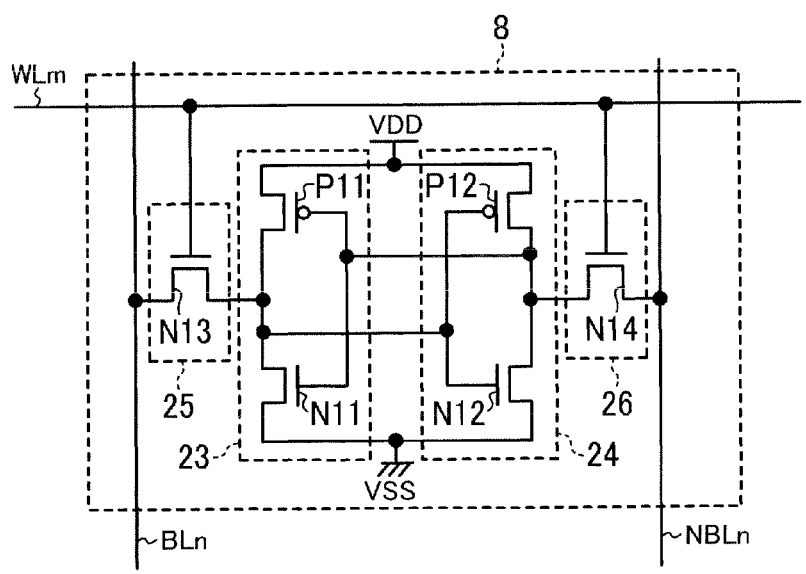
FIG. 2 is a circuit diagram showing a detailed configuration of one memory cell of FIG. 1.

The memory cell 8 of FIG. 2 includes six transistors, i.e., a P-channel transistor P11 and an N-channel transistor N11 which form a first inverter circuit 23, a P-channel transistor P12 and an N-channel transistor N12 which form a second inverter circuit 24 (the first and second inverter circuits 23 and 24 form a latch circuit), an N-channel transistor N13 (circuit 25) which connects a first latch node and the bit line BLn together, an N-channel transistor N14 (circuit 26) which connects a second latch node and the bit line NBLn together (the circuits 25 and 26 control input and output of data to and from the latch circuit).

Figure 3:
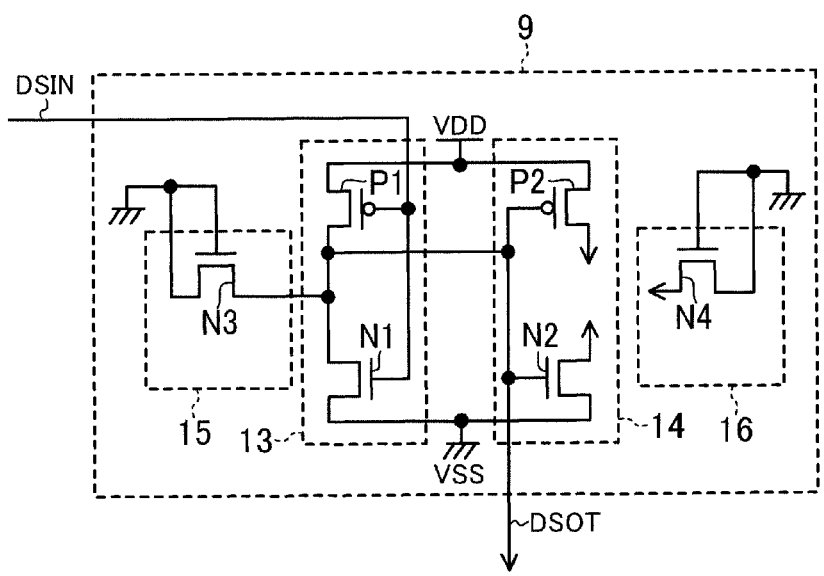
FIG. 3 is a circuit diagram showing a detailed configuration of one dummy memory cell of FIG. 1.
Figure 5:
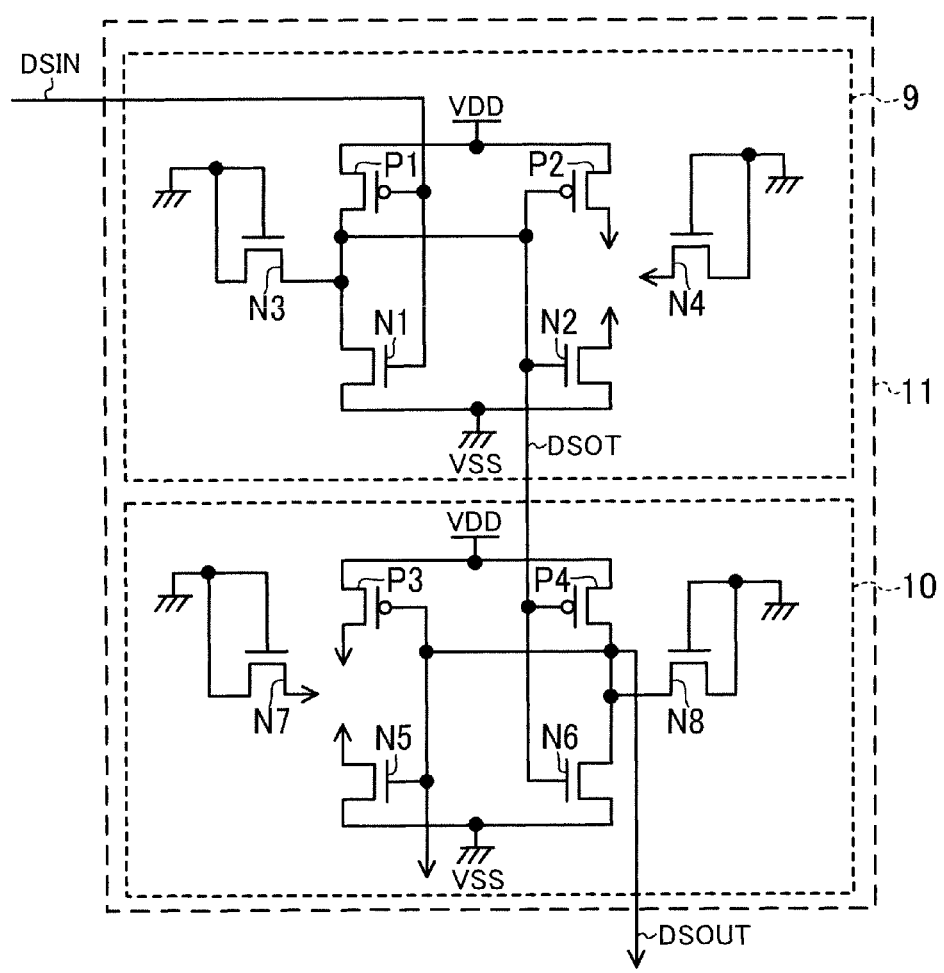
FIG. 5 is a circuit diagram showing a detailed configuration of one dummy memory cell array of FIG. 1.

The dummy memory cell array block 2 includes dummy memory cells. The number of the dummy memory cells arranged in the bit line direction is the same as the number of the memory cells 8 arranged in the bit line direction in the memory cell array block 1. As shown in FIGS. 3 and 5, each of the first and second dummy memory cells 9 and 10 includes six transistors, i.e., two P-channel transistors and four N-channel transistors, as with the memory cell 8. The first and second dummy memory cells 9 and 10 included in a first dummy memory cell array 11 have a connection relationship shown in FIG. 5 and are connected together by a signal DSOT.

The control circuit 5 receives external input signals, i.e., a control signal, an address signal, and a clock signal, to control activation of the row decoder 3 and the first driver circuit 6. The first driver circuit 6 activates an input signal DSIN to the first dummy memory cell 9 included in the first dummy memory cell array 11 based on a reference signal ISE supplied from the control circuit 5. The second driver circuit 7 amplifies an output signal DSOUT of the second dummy memory cell 10 included in the first dummy memory cell array 11. An output signal SEN of the second driver circuit 7 is a sense amplifier activation signal for activating the sense amplifiers 4.

A second dummy memory cell array 12 includes the dummy memory cells excluding the first and second dummy memory cells 9 and 10. All of the dummy memory cells included in the second dummy memory cell array 12 are connected together in a manner similar to that of the first and second dummy memory cells 9 and 10 (i.e., according to similar connection specifications). Note that an input signal to the second dummy memory cell array 12 is fixed to a VSS power supply.

In the first dummy memory cell 9 of FIG. 3, the gate and source of each of N-channel transistors N3 and N4 (source circuits 15 and 16) corresponding to the two N-channel transistors of the memory cell 8 which control input and output of data to and from the latch circuit are fixed to the VSS power supply. Of an inverter circuit 13 and a circuit 14 corresponding to a latch circuit, an input signal to the inverter circuit 13 is controlled based on a signal DSIN, and the output is connected to the signal DSOT. An input signal to the circuit 14 is connected to the signal DSOT. The outputs of a P-channel transistor P1 and an N-channel transistor N1 included in the inverter circuit 13 are connected to the input of the circuit 14. The outputs of a P-channel transistor P2 and an N-channel transistor N2 included in the circuit 14 are open. The inverter circuit 13 and the circuit 14 do not form a latch circuit.

Figure 4:
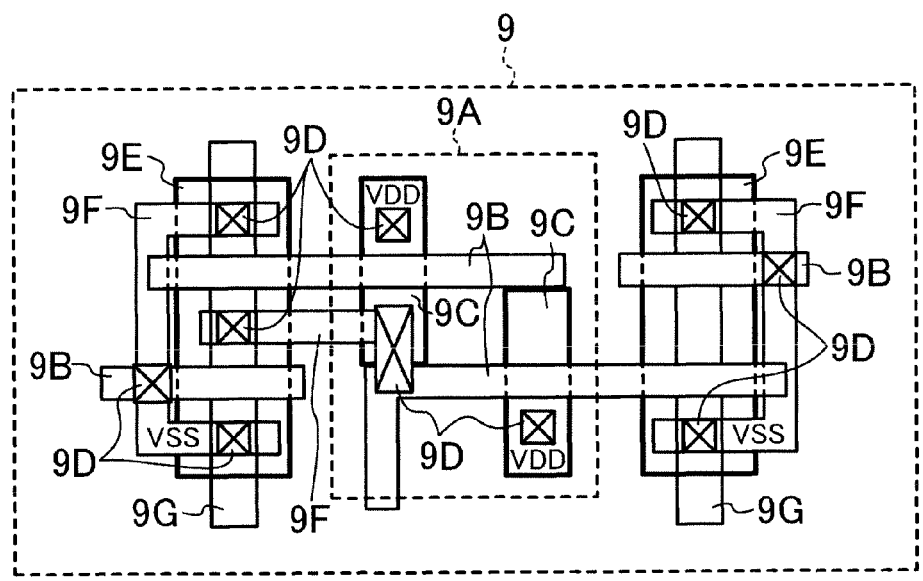
FIG. 4 is a diagram showing a layout of the dummy memory cell of FIG. 3.

FIG. 4 shows a specific layout of the first dummy memory cell 9 of FIG. 3. The P-channel transistors P1 and P2 of FIG. 3 each include a P-channel diffusion layer 9C and a transistor gate electrode 9B in an N-well region 9A. One of the P-channel diffusion layers 9C is connected to a VDD power supply line by a via hole 9D which connects the diffusion layer and a metal interconnect together. The other diffusion layer has a via hole which connects the diffusion layer and the transistor gate electrode 9B together. In the P-channel transistor P2, the drain is open, and therefore, the via hole 9D is not provided in the other diffusion layer.

The N-channel transistors N1, N2, N3, and N4 of FIG. 3 each include an N-channel diffusion layer 9E and a transistor gate electrode 9B in a P-well region. The N-channel transistors NI and N2 are connected together by the transistor gate electrode 9B and a transistor gate electrode provided in the P-channel diffusion layer 9C. One of the N-channel diffusion layers is connected to a VSS power supply line by a via hole 9D which connects the diffusion layer and a metal interconnect together. The N-channel transistors N3 and N4 each include a transistor gate electrode 9B provided in the other N-channel diffusion layer. The gate and source of each of the N-channel transistors N3 and N4 are connected to a VSS power supply line by a first metal interconnect 9F and a via hole 9D. A second metal interconnect 9G is used as a bit line in the memory cell array block 1, however, no bit line is present in the circuit diagram of FIG. 3, and therefore, the second metal interconnect 9G is only provided in FIG. 4.

The first dummy memory cell array 11 of FIG. 5 includes the first dummy memory cell 9 of FIG. 3, and the second dummy memory cell 10 which has a circuit configuration including P-channel transistors P3 and P4 and N-channel transistors N5, N6, N7, and N8 (the first and second dummy memory cells 9 and 10 are symmetric to each other with respect to a vertical line) and has the output signal DSOUT. The output signal DSOT of the first dummy memory cell 9 is an input signal to the second dummy memory cell 10. In the first dummy memory cell array 11, two inverter circuits having the input signal DSIN and the output signal DSOUT are connected together in series.

Figure 6:
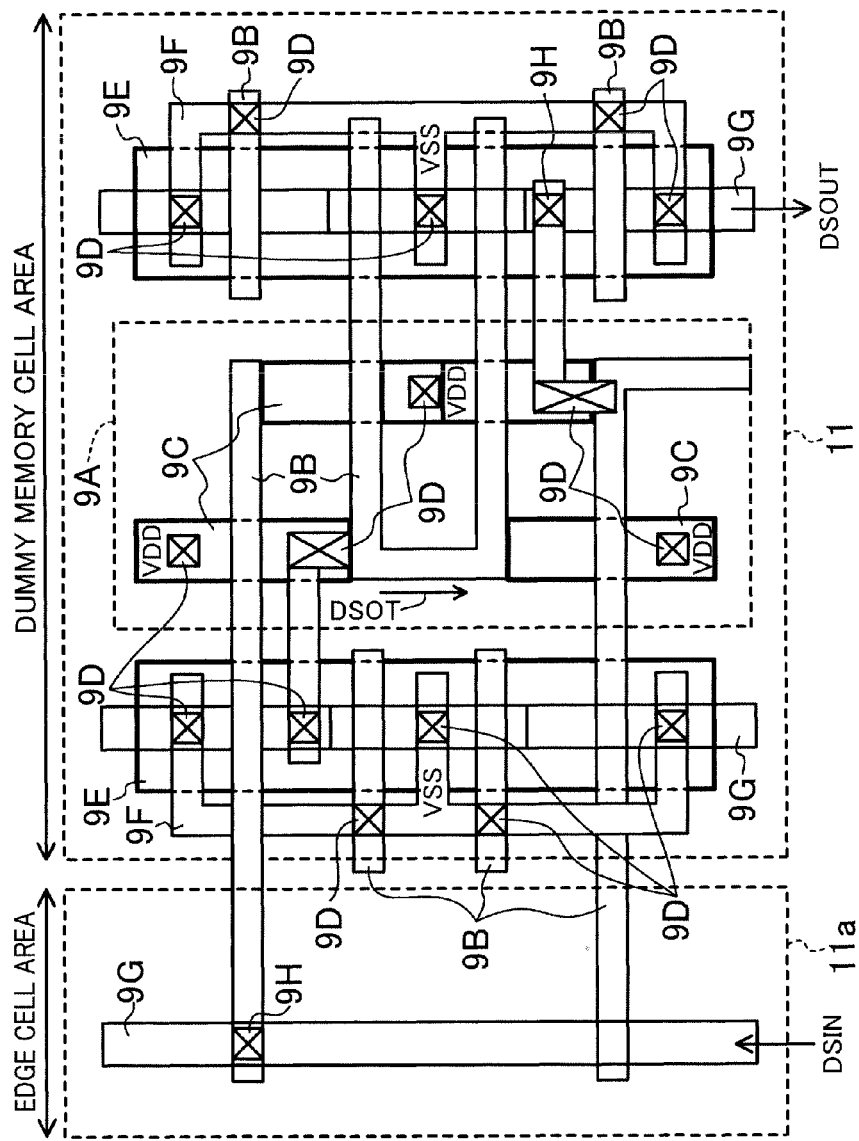
FIG. 6 is a diagram showing a layout of the dummy memory cell array of FIG. 5.

FIG. 6 shows a specific layout configuration of the first dummy memory cell array 11 of FIG. 5. The layout and connection of FIG. 6 are symmetric to the layout and connection of FIG. 4 with respect to a horizontal line. The connection line DSOT of FIG. 5 between the first and second dummy memory cells 9 and 10 is connected by the transistor gate electrode 9B. The input signal DSIN of the first dummy memory cell 9 is connected to the first dummy memory cell 9 by a second metal interconnect 9G provided in an edge cell array 11 a provided at a boundary between the dummy memory cell area and the row decoder 3, and a via hole 9H which connects the second metal interconnect 9G and the transistor gate electrode 9B together. For the output signal DSOUT of the second dummy memory cell 10, the diffusion layer which is not connected to the VSS power supply line by the via hole 9D in the N-channel diffusion layer of the first dummy memory cell 9, is connected by the via hole 9H to the second metal interconnect 9G which is used as a bit line in the memory cell array block 1.

The read operation of the semiconductor memory device thus configured will be described. Initially, in order to access a desired memory cell in response to an external read command, the control circuit 5 activates a desired word line (e.g., WL0) in the row decoder 3. As a result, the two N-channel transistors which control input and output of the memory cell 8 are activated to read data to the bit line pairs BL0/NBL0-BLn/NBLn.

Next, the driver circuit 6 is activated by the reference signal ISE for activating the sense amplifiers 4 from the control circuit 5, to generate the signal DSIN. The signal DSIN is an input signal to the first dummy memory cell 9 in the first dummy memory cell array 11, and is passed through one inverter circuit 13 to generate the signal DSOT which is an inverted version of the signal DSIN. In this case, the circuit 14 is an output load to the inverter circuit 13 and serves as a delay circuit. Next, the signal DSOT is input to the second dummy memory cell 10, which in turn inverts the input signal and outputs the resulting signal, i.e., the signal DSOUT having the same phase as that of the signal DSIN. In this case, one of the circuits is an output load to the inverter circuit in the second dummy memory cell 10 and serves as a delay circuit. Thus, the second driver circuit 7 for shaping the waveform of the signal DSOUT which has been obtained by delaying the reference signal ISE generates a sense amplifier activation signal SEN which is used to activate the sense amplifiers 4 in order to amplify data read to the bit line pairs BL0/NBL0-BLn/NBLn with optimum timing, resulting in higher-speed read operation.

As described above, during read operation, the timing of activating the sense amplifiers 4 is delayed by transistors which are fabricated by the same process as those of the memory cells 8. As a result, an inverter delay circuit which can provide considerably fine timing can be advantageously easily obtained by adjusting the transistor size and the number of stages of transistors. Although the characteristics of a memory cell vary depending on corner conditions of process, voltage, temperature, etc., the circuit operation guaranteed range which can be achieved by the satisfactory following capability of circuit operation obtained by using transistors having similar characteristics which cannot be achieved by logic transistors, can be increased. These two features can be simultaneously achieved. As a result, even if a circuit operation margin for increasing the speed is reduced, the read operation range can be increased without erroneous operation compared to the conventional art. Similar to a timing generation circuit which employs conventional dummy memory cells, a delay circuit is formed using dummy memory cells, whereby the area overhead for generating can be reduced.

Note that the reason why the dummy memory cell array block 2 preferably has the same circuit configuration as that of the memory cell array block 1 is that defects can be reduced to the extent possible in the process of forming the memory cell transistors. For example, even if an independent transistor which is not shared by the memory cell array block 1, such as the N-channel transistor N4, is removed, i.e., the dummy memory cell array block 2 has a circuit configuration different from that of the memory cell array block 1, the inverter delay circuit which has the same memory cell transistor forming process and generates sense amplifier timing may, of course, be achieved.

In this embodiment, the delay circuit includes two serially-connected inverter circuits including dummy memory cells. Alternatively, three or more serially-connected inverter circuits including dummy memory cells may be employed. In this embodiment, an even number of delay circuits serially connected together are shown. Alternatively, even if an odd number of delay circuits serially connected together are employed, the control circuit 5 and the first and second driver circuits 6 and 7 may, of course, be modified to generate a logically correct sense amplifier activation signal.

The drain nodes of the P-channel transistor P2 and the N-channel transistor N2 of FIG. 3 are open. Alternatively, the drain nodes may be connected together in the inverter circuit. The source and gate of each of the N-channel transistors N3 and N4 are both connected and fixed to the VSS power supply. Alternatively, for example, only the gate node of each of the N-channel transistors N3 and N4 may be connected to the interconnect DSOT and may be used as a MOS capacitor for the inverter circuit, i.e., may, of course, be fixed to the inverter circuit in a manner which does not cause logical contradiction.

As shown in FIG. 1, the dummy memory cell array block 2 is arranged in the same column direction as that of the memory cell array block 1. Also, as shown in FIG. 1, the dummy memory cell array block 2 is arranged adjacent to one of end portions of the memory cell array block 1.

Thus, the dummy memory cell array block 2 is arranged in the same column direction as that of the memory cell array block 1 and is arranged adjacent to one of the end portions of the memory cell array block 1, whereby defects can be reduced to the extent possible in the process of forming the memory cell transistors. In particular, if the same number of dummy memory cells as that of memory cells are provided, defects can, of course, be reduced to a further extent. If the dummy memory cell array block 2 is arranged in the column direction, the bit line pair which is used to read data from the memory cell array block 1 and the timing generation signal line for activating the sense amplifiers 4 are both arranged in the column direction. Therefore, for example, even if the number of memory cells in the column direction is different, the sense amplifier activation signal can be generated while reducing timing error. Because the dummy memory cell array block 2 is arranged adjacent to one of the end portions of the memory cell array block 1, the dummy memory cell region can be included in the memory cell region. Therefore, the separation region between the memory cell region and the peripheral circuit (logic circuit) region can be reduced or minimized, resulting in an improvement in area efficiency.

Note that the dummy memory cell array block 2 is arranged in the column direction. Alternatively, the dummy memory cell array block 2 may, of course, be arranged in the row direction if the inverter delay circuit can be similarly achieved. In this embodiment, the dummy memory cell array block 2 includes a single line of dummy memory cells. Alternatively, the inverter delay circuit may, of course, include a plurality of lines of dummy memory cells.

Note that the dummy memory cell array block 2 is arranged adjacent to one of the end portions of the memory cell array block 1. In order to increase the speed, the dummy memory cell array block 2 is preferably arranged adjacent to the peripheral circuit portion on the row decoder 3 side. If priority is given to the safety of circuit operation, the dummy memory cell array block 2 is preferably adjacent to the side opposite to the row decoder 3 of the memory cell array block 1. Alternatively, the dummy memory cell array block 2 may, of course, be provided on both sides in view of the above circuit characteristics.

As shown in FIG. 3, as the inverter circuit 13, an inverter circuit of a portion corresponding to the data holding circuit included in the memory cell 8 is used. By thus utilizing the inverter circuit 13 present in the circuit configuration of the memory cell, the influence of the layout change can be reduced, and therefore, defects can be reduced to the extent possible in the process of forming the memory cell transistors.

Note that the inverter circuit in the data holding circuit portion is used. In this case, for example, even if the size of the transistor diffusion layer or the gate dimension is different from that of the memory cells 8 due to the delay time adjustment, this may, of course, be acceptable unless the occurrence of defects in the process of forming the memory cell transistors causes a significant problem.

As shown in the layout of FIG. 6, a plurality of dummy memory cells are connected by connecting the gate electrodes of the P-channel transistors P2 and P4 of the data holding circuits included in the adjacent first and second dummy memory cells 9 and 10. By thus connecting the gate electrodes of adjacent transistors of dummy memory cells, the layout configuration which is not significantly different from that of the memory cells 8 can be achieved without the need of a metal interconnect or a via hole which are typically required to connect transistors together. Therefore, an increase in the areas of the first and second dummy memory cells 9 and 10, and defects in the process of forming the memory cell transistors, can be reduced to the extent possible.

The length in the column direction of the dummy memory cell array block 2 is equal to that of the memory cell array block 1. In the second dummy memory cell array 12 including dummy memory cells other than connected dummy memory cells, the input of the inverter circuit of the second dummy memory cell array 12 is fixed to the ground potential or the power supply potential. If the dummy memory cell array block 2 and the memory cell array block 1 thus have equal lengths in the column direction, defects can be reduced to the extent possible in the process of forming the memory cell transistors. Also, by fixing the potential of the second dummy memory cell array 12 which is not used as an inverter delay circuit, the influence of signal noise etc. on the memory cell array block 1 can be reduced.

Note that FIG. 1 shows that only the input of the inverter circuit in the first stage to the second dummy memory cell array 12 is set to the ground potential, and the inverter circuits of the other dummy memory cells are connected together in series as in the first dummy memory cell array 11. Alternatively, of course, the inverter circuits may not be connected together in series, and the inverter circuit of each dummy memory cell may be fixed to the ground potential or the power supply potential. Although the input is assumed to be at the ground potential or the power supply potential, the signal fixed to the ground potential or the power supply potential which is generated by the control circuit 5 etc. may, of course, be employed.

The input signal line of the inverter circuit of one in the first stage of the plurality of dummy memory cells connected together and the output signal line of the inverter circuit of one in the final stage of the plurality of dummy memory cells connected together are arranged in the column direction. A dummy bit line connected to a dummy memory cell is used as the output signal line of the inverter circuit in the final-stage dummy memory cell.

By thus arranging the input signal line in the column direction, for example, the metal interconnect on the dummy memory cell can be efficiently used, whereby the area overhead for the signal line can be reduced. Similarly, by arranging the output signal line in the column direction, the metal interconnect which is not used on the dummy memory cell and serves as a bit line on the memory cell can be effectively used in addition to the above advantage, whereby the area overhead can be reduced.

The number of stages of dummy memory cells connected together can be caused to be variable only in the contact layer in which the output signal of the inverter circuit is connected to the dummy bit line. If the number of stages of dummy memory cells is thus variable only in the contact layer, delay can also be easily adjusted during chip fabrication as in the case of mask read only memory (ROM).

<<Second Embodiment>>

A semiconductor memory device according to a second embodiment of the present disclosure will be described with reference to a circuit diagram shown in FIG. 7. In the semiconductor memory device of FIG. 7, a dummy memory cell array 11*b* is different from the first dummy memory cell array 11 of FIG. 5 in that the gate of an N-channel transistor N3 in a first dummy memory cell 9*b* is connected to a signal line DSIN, and the N-channel transistor N3 is connected in parallel to an N-channel transistor N1 of an inverter circuit including a P-channel transistor P1 and the N-channel transistor N1. Similarly, in a second dummy memory cell 10*b*, by connecting the gate of an N-channel transistor N8 to a signal line DSOT, the N-channel transistor N8 is connected in parallel to an N-channel transistor N6. The read operation of this configuration is the same as that of the first embodiment.

Figure 7:
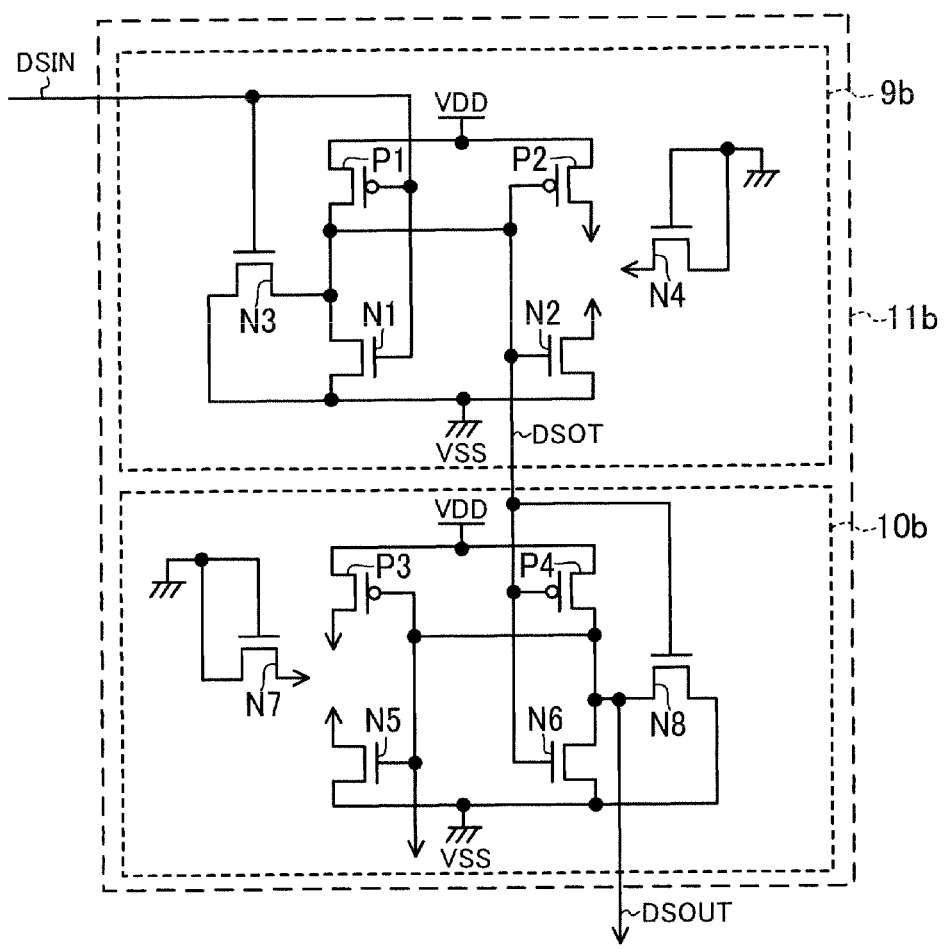
FIG. 7 is a circuit diagram showing one dummy memory cell array in a semiconductor memory device according to a second embodiment of the present disclosure.
Figure 8:
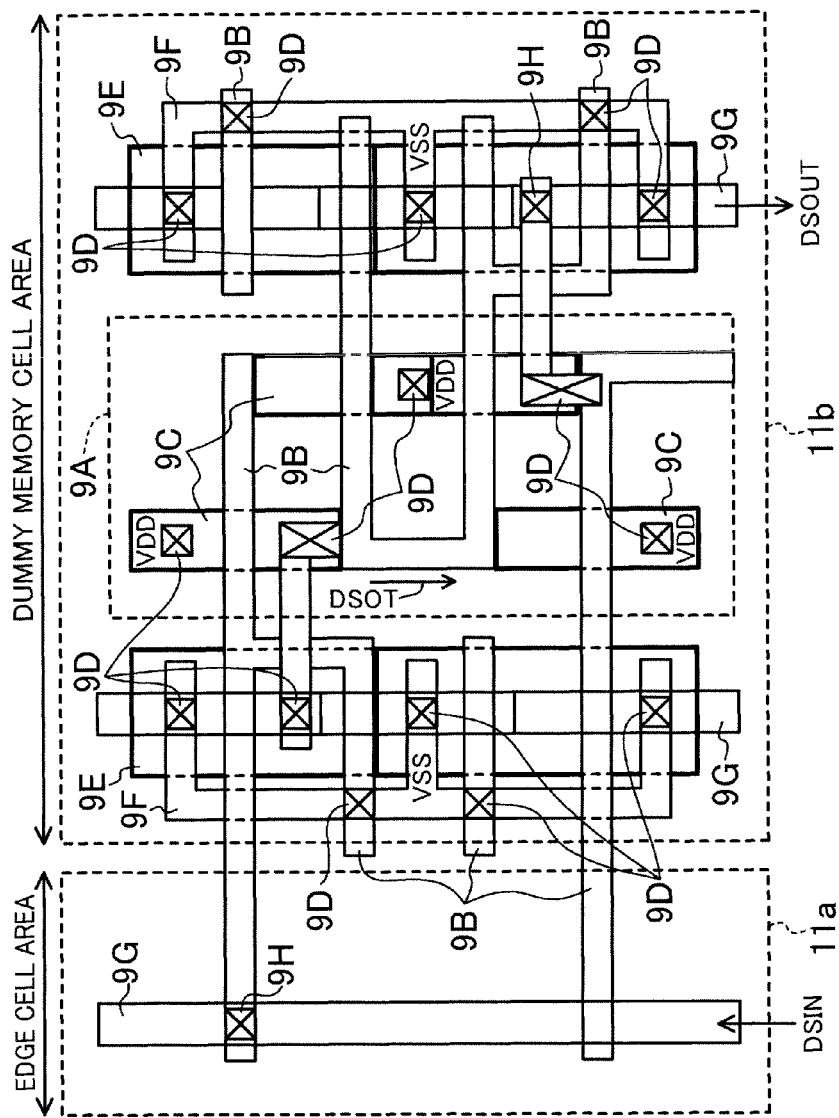
FIG. 8 is a diagram showing a layout of the dummy memory cell array of FIG. 7.

FIG. 8 shows the layout of the configuration of FIG. 7. The layout of FIG. 8 is achieved by connecting the transistor gate electrodes 9B of the N-channel transistors N1 and N3 together in the layout of FIG. 6.

As described above, by connecting the N-channel transistor N3 in parallel to the N-channel transistor N1 of the inverter circuit, the considerably low current capability of the memory cell transistors can be improved, and therefore, not only a delay time can be adjusted by finer time steps, but also variations in the capability of the N-channel transistors can be reduced.

Note that the second embodiment may be combined with the first embodiment to provide effective advantages.

<<Third Embodiment>>

Figure 9:
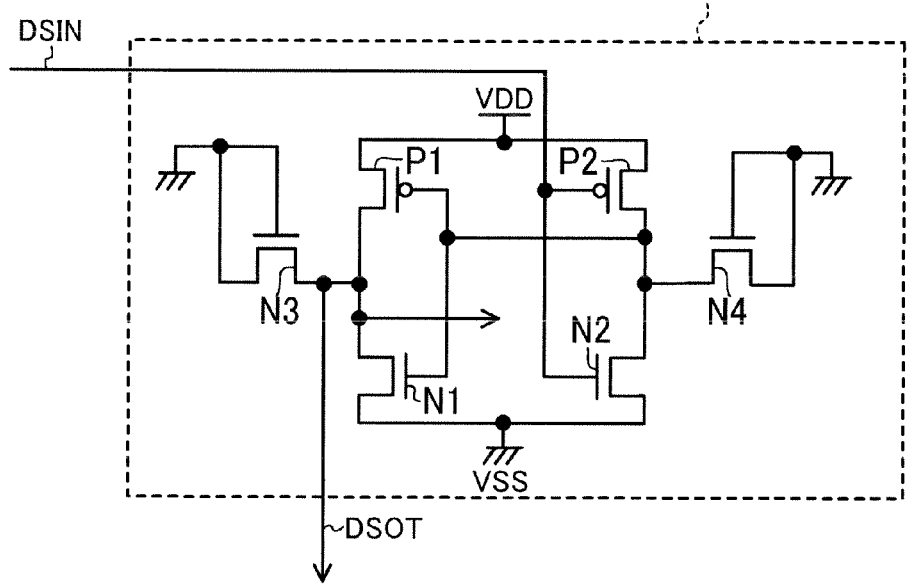
FIG. 9 is a circuit diagram showing one dummy memory cell in a semiconductor memory device according to a third embodiment of the present disclosure.

A semiconductor memory device according to a third embodiment of the present disclosure will be described with reference to a circuit diagram shown in FIG. 9. A dummy memory cell 9*c* of the semiconductor memory device of FIG. 9 has a configuration in which an inverter circuit including a P-channel transistor P1 and an N-channel transistor N1 and an inverter circuit including a P-channel transistor P2 and an N-channel transistor N2 (the two inverters form a latch circuit) are connected together in series. The read operation of this configuration is the same as that of the first embodiment.

As described above, the two inverter circuits in the latch circuit are used as a delay circuit, whereby the number of dummy memory cells used as a delay circuit can be reduced, and therefore, an increase in the area of the inverter delay circuit portion can be reduced.

Note that the third embodiment may be combined with the first and second embodiments to provide effective advantages.

<<Fourth Embodiment>>

Figure 10:
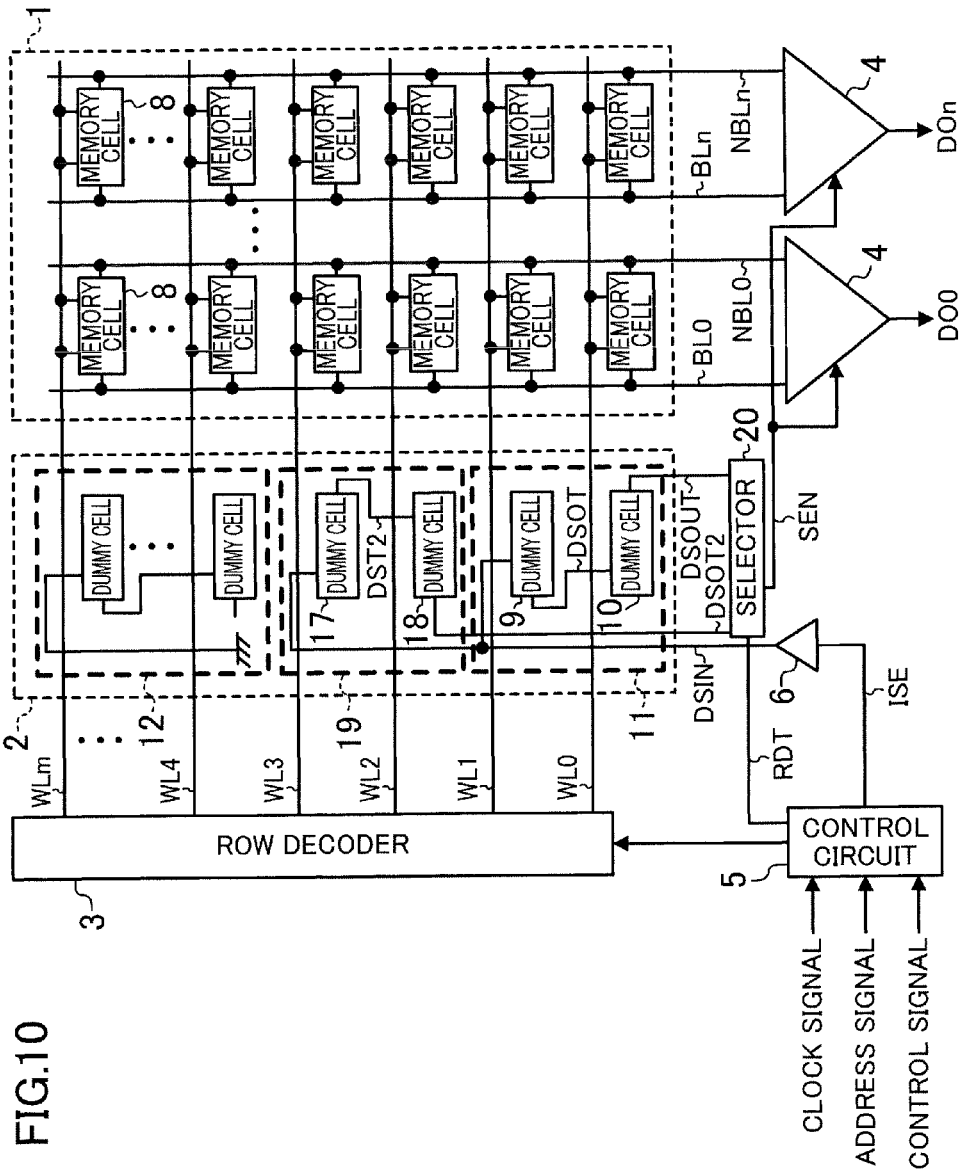
FIG. 10 is a block diagram showing a main configuration of a semiconductor memory device according to a fourth embodiment of the present disclosure.

A semiconductor memory device according to a fourth embodiment of the present disclosure will be described with reference to FIGS. 10 and 11. The semiconductor memory device of FIG. 10 includes, in addition to the configuration of FIG. 1, a third dummy memory cell array 19 having an input signal DSIN and an output signal DSOT2 and including a third and a fourth dummy memory cell 17 and 18, and a selector 20 which outputs one of output signals DSOUT and DSOT2 from a first dummy memory cell array 11 and the third dummy memory cell array 19 based on a select signal RDT from a control circuit 5. The dummy memory cell block 2 includes the first dummy memory cell array 11 including a first and a second dummy memory cell 9 and 10, the third dummy memory cell array 19 including the third and fourth dummy memory cells 17 and 18, and a second dummy memory cell array 12 including dummy memory cells other than the first-fourth dummy memory cells 9, 10, 17, and 18.

Figure 11:
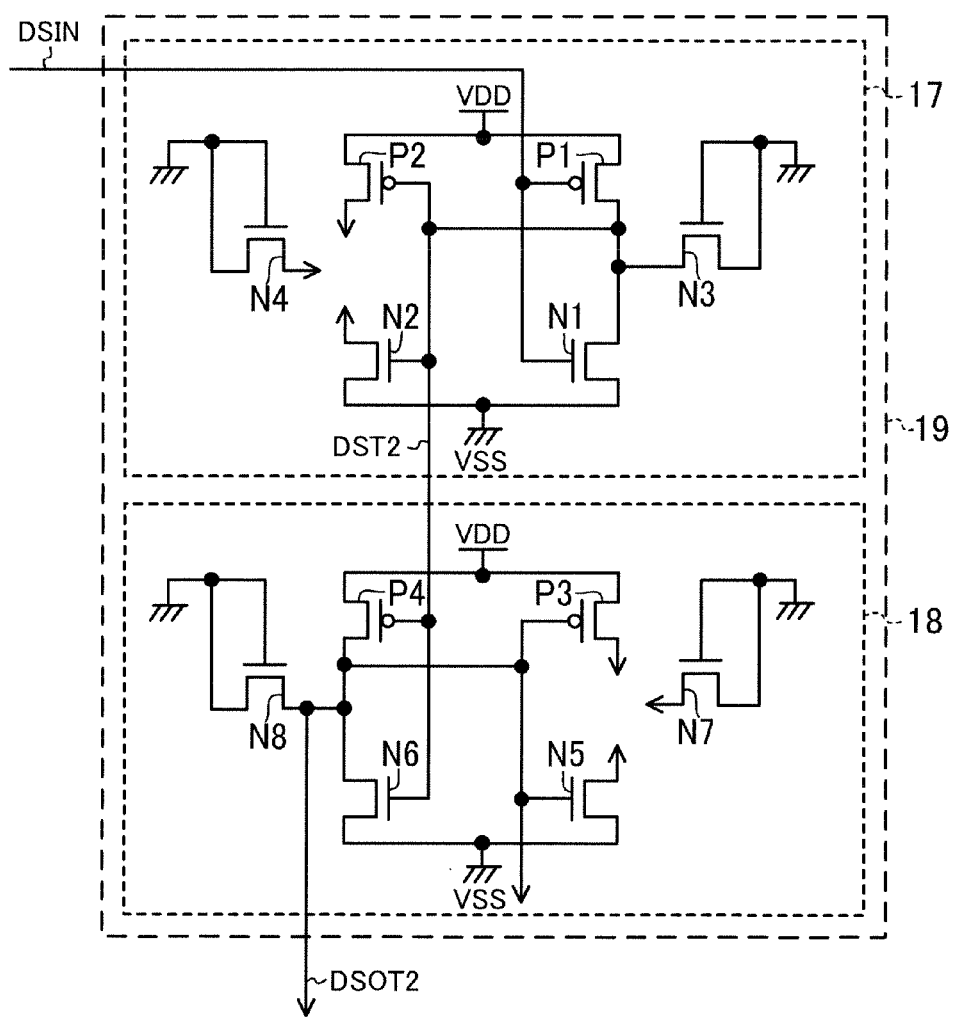
FIG. 11 is a circuit diagram showing one dummy memory cell array of FIG. 10.

FIG. 11 is a circuit diagram showing the third dummy memory cell array 19, which is symmetric to the circuit diagram of FIG. 5 with respect to a vertical line. The third and fourth dummy memory cells 17 and 18 included in the third dummy memory cell array 19 have a connection relationship shown in FIG. 11 and are connected together via a signal DST2.

The read operation of the above configuration is similar to that of the first embodiment, except that the signal selected by the selector 20 based on the select signal RDT generated by the control circuit 5 is used as a control signal SEN for activating sense amplifiers 4.

As described above, the output signal lines DSOUT and DSOT2 of the inverter circuits of ones in the final stages of the first and third dummy memory cell arrays 11 and 19 are output, respectively, i.e., one line for each array, whereby one of the delay circuits formed by the first and third dummy memory cell arrays 11 and 19 can be selected, and therefore, the delay time can be easily adjusted.

The first and third dummy memory cell arrays 11 and 19 are arranged in a line in the column direction. By thus arranging the first and third dummy memory cell arrays 11 and 19 in a line in the column direction, the delay circuit portion including only one line of dummy memory cells can be provided, and therefore, the area overhead of the first and third dummy memory cell arrays 11 and 19 can be reduced.

There are the two dummy memory cell arrays 11 and 19 each having an output signal line, and the dummy bit line pair is employed in which the respective output signal lines are provided on the dummy memory cells. By thus utilizing the bit line pair on the memory cells arranged in the column direction as the output signal lines of the two inverter delay circuits on the dummy memory cells, the area overhead of the output signal lines can be reduced.

The two dummy memory cell arrays include different numbers of inverter circuits. By thus providing the dummy memory cell arrays including different numbers of inverter circuits, the inverter delay circuits can have different delay times, and therefore, sense amplifier activation timings can be easily switched.

The control signal RDT which is used to switch the selector 20 is controlled based on a signal from a metal or electrical fuse circuit. By thus performing the switching control using the metal or electrical fuse circuit, the sense amplifier activation timing can be easily adjusted even after device fabrication.

Note that in the switching control using the metal or electrical fuse circuit, dummy memory cells may be used to repair or replace a defective cell in the dummy memory cell array of the semiconductor memory device, and dummy memory cells may be used to increase the circuit operation range. It has been assumed above that the dummy memory cell arrays have different numbers of inverter circuits, the dummy memory cell arrays may, of course, have the same number of inverter circuits.

Note that this embodiment may be combined with all of the above embodiments to provide more effective advantages.

Although the first-fourth embodiments have been described, the present disclosure is not limited to the embodiments. For example, although the embodiments have been described using a memory cell including six transistors, the present disclosure is applicable to SRAM including memory cells each including eight transistors.

The semiconductor memory device of the present disclosure particularly has a technique of generating accurate sense amplifier activation timing using a dummy memory cell portion, and is useful, for example, for a system LSI circuit including a large number of memory devices having a variety of specifications.

What is claimed is:

1. A semiconductor memory device comprising:
   a memory cell array including a plurality of memory cells each including a data holding circuit configured to store data using a first and a second circuit elements and a transistor configured to connect the data holding circuit and a bit line together; and
   a dummy memory cell array including a plurality of dummy memory cells each having the same circuit configuration as that of the memory cell with respect to the element size and the layout configuration,
   wherein
   the plurality of dummy memory cells each include at least one inverter circuit configuration, and are connected together by the inverter circuits being connected together in series.

2. The semiconductor memory device of claim 1, wherein the dummy memory cells are arranged in the same column direction in which the memory cells are arranged.

3. The semiconductor memory device of claim 1, wherein the dummy memory cells are arranged adjacent to one of end portions of the memory cell array.

4. The semiconductor memory device of claim 1, wherein the inverter circuit is one included in the data holding circuit.

5. The semiconductor memory device of claim 1, wherein N-channel transistors included in the inverter circuit are an N-channel transistor included in the data holding circuit and an N-channel transistor connecting the data holding circuit and a dummy bit line provided on the dummy memory cell together, which are connected together in parallel.

6. The semiconductor memory device of claim 1, wherein the data holding circuit includes two inverter circuits connected together in series.

7. The semiconductor memory device of claim 1, wherein the plurality of dummy memory cells are connected by connecting gate electrodes of P-channel transistors of the data holding circuits included in adjacent ones of the dummy memory cells together.

8. The semiconductor memory device of claim 1, wherein a length in a column direction of the dummy memory cell array is equal to that of the memory cell array, and in the dummy memory cells other than the plurality of dummy memory cells connected together, an input of the inverter circuit is fixed to a ground potential or a power supply potential.

9. The semiconductor memory device of claim 1, wherein an input signal line of the inverter circuit of one in the first stage of the plurality of dummy memory cells connected together and an output signal line of the inverter circuit of one in the final stage of the plurality of dummy memory cells connected together are arranged in a column direction.

10. The semiconductor memory device of claim 9, wherein an output signal line of the inverter circuit of one in the final stage of the plurality of dummy memory cells connected together is a dummy bit line connected to the dummy memory cell.

11. The semiconductor memory device of claim 1, wherein the number of stages of the dummy memory cells connected together is variable only in a contact layer in which an output signal of the inverter circuit is connected to the dummy bit line.

12. The semiconductor memory device of claim 1, further comprising:
    a sense amplifier connected to the bit line directly or via a switch; and
    a drive circuit connected to an output signal of the inverter circuit of one in the final stage of the dummy memory cells,
    wherein
    an output of the drive circuit is an activation signal for the sense amplifier.

13. A semiconductor memory device comprising:
    a memory cell array including a plurality of memory cells each including a data holding circuit configured to store data using a first and a second circuit elements and a transistor configured to connect the data holding circuit and a bit line together;
    a word line arranged in a row direction and connected to the memory cells; and
    a plurality of dummy memory cell arrays each including a plurality of dummy memory cells having the same circuit configuration as that of the memory cell with respect to the element size and the layout configuration,
    wherein
    the plurality of dummy memory cells each include at least one inverter circuit configuration, and are connected together by the inverter circuits being connected together in series, an input signal line of the inverter circuit of one in the first stage of the plurality of dummy memory cells connected together and an output signal line of the inverter circuit of one in the final stage of the plurality of dummy memory cells connected together are arranged in the column direction, the plurality of dummy memory cell arrays are arranged in the column direction, and the output signal line of the inverter circuit of one in the final stage of the plurality of dummy memory cells connected together is output from each of the plurality of dummy memory cell arrays.

14. The semiconductor memory device of claim 13, wherein
    the plurality of dummy memory cell arrays are arranged in a line in the column direction.

15. The semiconductor memory device of claim 13, wherein
    there are two of the dummy memory cell arrays having the output signal line, and each of the output signal lines uses a dummy bit line pair provided on the dummy memory cell.

16. The semiconductor memory device of claim 15, wherein
    the two dummy memory cell arrays include different numbers of inverter circuits.

17. The semiconductor memory device of claim 13, further comprising:
    a sense amplifier connected to the bit line directly or via a switch; and
    a selector configured to switch the output signal lines,
    wherein
    an output of the selector is an activation signal for the sense amplifier.

18. The semiconductor memory device of claim 17, wherein
a signal for controlling the selector is a signal from a metal or electrical fuse circuit.

* * * * *